(12) United States Patent
Shin

(10) Patent No.: US 7,557,020 B2
(45) Date of Patent: Jul. 7, 2009

(54) METHOD FOR FABRICATING THIN FILM TRANSISTOR USING METAL CATALYST LAYER

(75) Inventor: Hyun-Eok Shin, Gunpo-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 245 days.

(21) Appl. No.: 11/109,679

(22) Filed: Apr. 20, 2005

(65) Prior Publication Data

US 2006/0063315 A1 Mar. 23, 2006

(30) Foreign Application Priority Data

Sep. 22, 2004 (KR) .................... 10-2004-0076109

(51) Int. Cl.
*H01L 21/36* (2006.01)
*H01L 21/20* (2006.01)

(52) U.S. Cl. .............. 438/486; 257/E21.133; 438/166

(58) Field of Classification Search ............. 438/486, 438/417, 166; 257/E21.133
See application file for complete search history.

(56) References Cited

U.S. PATENT DOCUMENTS

| | | | | |
|---|---|---|---|---|
| 5,851,920 | A * | 12/1998 | Taylor et al. | 438/648 |
| 6,558,986 | B1 * | 5/2003 | Choi | 438/149 |
| 2004/0142543 | A1 * | 7/2004 | Fukunaga et al. | 438/486 |
| 2004/0192042 | A1 * | 9/2004 | Sirringhaus et al. | 438/689 |

FOREIGN PATENT DOCUMENTS

| | | |
|---|---|---|
| JP | 06-260651 | 9/1994 |
| JP | 08-097137 | 4/1996 |
| JP | 2001-53288 | 2/2001 |
| JP | 2001210832 | 8/2001 |
| JP | 2003-109904 | 4/2003 |
| JP | 2003-163165 | 6/2003 |
| KR | 10-1998-0012639 A1 * | 6/1998 |
| KR | 10-2003-0005910 A1 | 1/2003 |
| KR | 1020030060403 | 7/2003 |
| KR | 10-2004-0019594 | 3/2004 |

OTHER PUBLICATIONS

Yeo-Geon Yoon, et al., "Metal-Induced Lateral Crystallization of a-Si Thin Films by Ni-Co Alloys and the Electrical Properties of Poly-Si TFTs", IEEE Electron Device Letters, vol. 24, No. 10, Oct. 2003.

* cited by examiner

Primary Examiner—Asok K Sarkar
(74) Attorney, Agent, or Firm—H.C. Park & Associates, PLC

(57) ABSTRACT

A method of fabricating a thin film transistor can include forming a metal catalyst layer on a substrate on which an amorphous silicon layer and a capping layer are formed. The metal catalyst may be formed using a sputtering target in which a composition ratio of the metal catalyst is controlled in the process of forming the sputtering target. The target may be composed of the metal catalyst and a metal with a larger atomic weight than the metal catalyst. The alloy may be formed with a predetermined composition ratio. The substrate may be annealed to crystallize the amorphous silicon layer to a polycrystalline silicon layer.

12 Claims, 4 Drawing Sheets

METHOD FOR FABRICATING THIN FILM TRANSISTOR USING METAL CATALYST LAYER

CROSS-REFERENCE TO RELATED APPLICATION

This application claims priority to and the benefit of Korean Patent Application No. 2004-76109, filed Sep. 22, 2004, which is incorporated herein by reference in its entirety.

BACKGROUND OF THE INVENTION

1. Field of the Invention

The present invention relates, for example, to a method for fabricating a thin film transistor. More particularly, it relates, for example, to a method for fabricating a thin film transistor that includes forming a metal catalyst layer of a predetermined composition on a substrate.

2. Description of the Related Art

Generally, thin film transistors (TFTs) used for flat display devices are fabricated as follows. Amorphous silicon is deposited on a transparent substrate such as glass or quartz. The amorphous silicon is then dehydrated and impurity ions for forming a channel are implanted. Subsequently, the amorphous silicon is crystallized to form a semiconductor layer. A gate insulating layer and a gate electrode are formed. Next, an ion implantation process is performed to form source and drain regions. Then an interlayer insulating layer and source and drain electrodes are formed.

The method for crystallizing the amorphous silicon into the polysilicon may include solid phase crystallization, excimer laser crystallization, metal induced crystallization, and metal induced lateral crystallization. The solid phase crystallization method anneals an amorphous silicon layer for several hours to tens of hours at a temperature of about 700° C. or less (the limiting temperature is typically the deformation temperature of the substrate material). The excimer laser crystallization method irradiates an excimer laser onto a silicon layer to locally heat the silicon layer to be crystallized for an extremely short time at a high temperature.

The metal induced crystallization method is a method in which a metal such as nickel, palladium, gold, or aluminum is implanted into or in contact with the amorphous silicon layer to induce the amorphous silicon to go through a phase change into polysilicon. The metal induced lateral crystallization method crystallizes the silicon layer by having silicide obtained from reaction between the metal and the silicon laterally extended to induce the sequential crystallization of silicon.

However, the solid phase crystallization method has a disadvantage that severe deformation of the substrate may occur when the substrate is annealed for a long time at a high temperature, and the excimer laser crystallization method has disadvantages that not only high-cost equipment and high maintenance cost are required but also the surface roughness of the polycrystalline silicon layer is poor. In metal induced crystallization and metal induced lateral crystallization, a metal material that induced the crystallization remains in the polycrystalline silicon layer and can increase leakage current in the semiconductor layer.

In order to solve the above-described disadvantages, a method of forming a capping layer on an amorphous silicon layer and forming a metal catalyst as a very thin metal catalyst layer by means of sputtering, and annealing it for crystallization is disclosed (Korean Patent Publication No. 2003-0060403), however, there exists a disadvantage that the metal catalyst layer should be formed to be extremely thin, that is, it should be formed with extremely low density.

SUMMARY OF THE INVENTION

The present invention, therefore, can help to solve problems associated with conventional devices by providing a method of fabricating a TFT. For example, a metal catalyst layer can be formed using a sputtering target that includes an alloy of a metal catalyst and a metal with a larger atomic weight than the metal catalyst. The metal catalyst and other metal can be present in a predetermined composition ratio. Then, the substrate of the TFT can be annealed. The density of the metal catalyst that induces crystallization at an interface of the amorphous silicon layer may be kept low in a uniform and stable manner. This control may not only enhance the size uniformity and the grain size of the polycrystalline silicon layer but also can minimize the amount of residual metal catalyst.

The present invention provides, for example, a method of fabricating a TFT. The method can include forming an amorphous silicon layer and a capping layer on a substrate, forming a metal catalyst layer on the capping layer using a target composed of an alloy containing a first metal and a second metal with a larger atomic weight than that of the first metal, annealing the substrate to crystallize the amorphous silicon layer to a polycrystalline silicon layer, and patterning the polycrystalline silicon layer to form a semiconductor layer.

DETAILED DESCRIPTION OF THE ILLUSTRATED EMBODIMENTS

Figure 1:
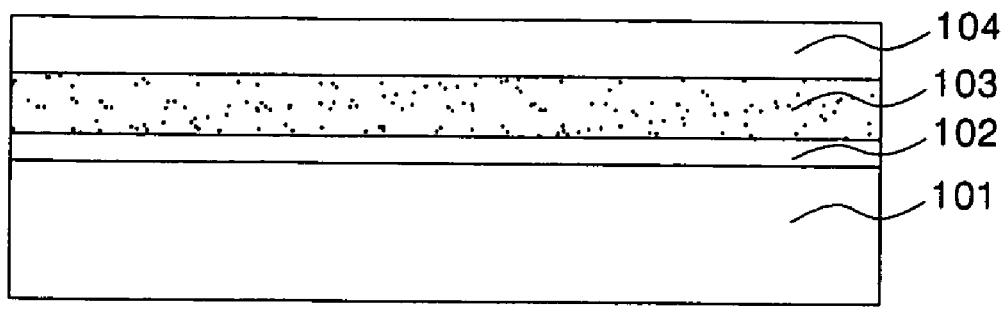
FIG. 1 is a cross-sectional view of a process of forming a buffer layer, an amorphous silicon layer, and a capping layer on a substrate.

The present invention will now be described in detail with reference to the accompanying drawings in which example embodiments of the invention are shown. The invention may, however, be embodied in different forms and should not be construed as limited to the embodiments shown and described. The dimensions in the drawings are exaggerated for clarity. The same reference numerals are used to denote the same elements throughout the specification.

FIG. 1 is a cross-sectional view of a process of forming a buffer layer, an amorphous silicon layer, and a capping layer on a substrate. As shown in FIG. 1, a single or multi-layer of silicon oxide or silicon nitride can be formed on a transparent substrate 101 such as glass or plastic using chemical vapor deposition (CVD) or physical vapor deposition (PVD). Thus, a buffer layer 102 can be formed. The buffer layer 102 may prevent moisture or impurities generated from the substrate below from diffusing. It can also (or alternatively) facilitate crystallization of a semiconductor layer by adjusting the heat transfer speed at the time of crystallization.

Subsequently, an amorphous silicon layer 103 can be formed on the buffer layer 102 using, for example, CVD or PVD. The amorphous silicon layer 103 can contain gases such as hydrogen that can cause a burst failure of the silicon layer during the crystallization process. Thus, they can yield a defect that can reduce electron mobility of the polycrystalline silicon layer after crystallization. Hence, a dehydration process should typically be performed. Annealing to dehydrate can be performed in a furnace for from tens of minutes to several hours at a temperature of about 400° C. or more.

Subsequently, a single or multi-layer of an insulating layer such as a silicon nitride layer or a silicon oxide layer can be formed on the amorphous silicon layer 103, thereby forming a capping layer 104. The capping layer 104 may cause selective diffusion (or penetration) of a metal catalyst of a subsequently formed metal catalyst layer 107. For example, a metal catalyst with a small atomic weight has a faster diffusion speed within the capping layer 104 while a heterogeneous metal with a larger atomic weight has a lower diffusion speed within the capping layer 104. Thus, the capping layer 104 may not allow the larger atomic weight metal to reach the interface of amorphous silicon layer 103.

Figure 2:
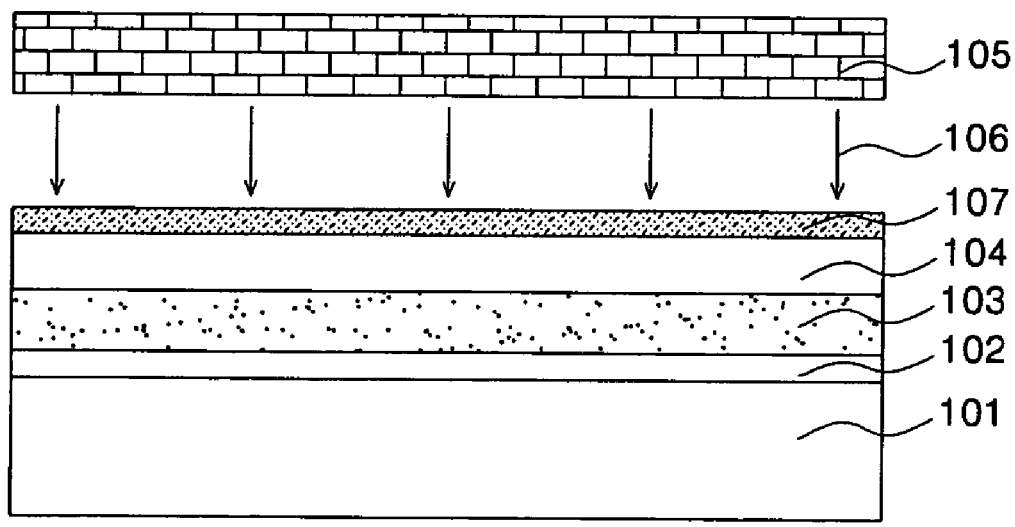
FIG. 2 is a cross-sectional view of a process of forming a metal catalyst layer on the capping layer by means of a sputtering method using a target formed of an alloy containing a metal catalyst and a heterogeneous metal.

FIG. 2 is a cross-sectional view of a process of forming a metal catalyst layer 107 on the capping layer 104 by means of a sputtering method using a target formed of an alloy of a first metal as a metal catalyst and a second metal having a larger atomic weight than the metal catalyst. As shown in FIG. 2, sputtering 106 can be performed on the target 105. The target 105 can be an alloy with a composition such that the first metal (as the metal catalyst) has a surface density of about $10^9$ to about $10^{15}$ atoms/cm$^2$. Preferably, the first metal has a surface density of $10^{13}$ to $10^{15}$ atoms/cm$^2$. The surface density of the first metal may be controlled by adjusting the composition ratio of the first metal of the target or adjusting the thickness of the metal catalyst layer 107. For example, the surface density may be decreased by decreasing the composition ratio of the first metal of the target or by decreasing the thickness of the metal catalyst layer 107.

The first metal can be, for example, Ni (nickel), Pd (palladium), Ti (titanium), Ag (silver), Au (gold), Al (aluminum), Sn (tin), Sb (antimony), Cu (copper), Co (cobalt), Mo (molybdenum), Tr (terbium), Ru (ruthenium), Rh (rhodium), Cd (cadmium), or Pt (platinum). The target may be formed such that the first metal has a composition ratio of about 0.1 to about 50 at % and the rest is formed of the second metal. Preferably, the first metal has a composition ratio of about 1 to about 2 at %. This is because such a ratio may be the minimum composition ratio allowing the first metal to be uniformly distributed within the alloy target when the alloy target is fabricated by the current technique. If such results are obtainable with a lower ratio, then a lower ratio could be used.

The second metal can have a larger atomic weight than the first metal. For example, when the first metal is nickel (Ni; element No. 28, atomic weight 53.70), metals with larger atomic weights than that of the nickel (for example, all metals after copper on the periodic table) may be used for the second metal. When the first metal is nickel, the alloy can, for example, be fabricated using molybdenum (Mo; atomic No. 42, atomic weight 95.94) or tungsten (W; atomic No. 74, atomic weight 183.84) for the second metal. This is because Mo and W each have an atomic weight about two or three times larger than Ni. Thus their diffusion speeds within the capping layer are about two or three times lower than that of Ni. Generally, the diffusion speed within the capping layer can be inversely proportional to the atomic weight.

When a metal catalyst layer with a surface density of $10^{13}$ to $10^{15}$ atoms/cm$^2$ was formed to be about 1 Å thick using the first metal target (in the conventional approach), it was extremely difficult to control the sputtering method for forming the metal catalyst layer. However, when an alloy target containing the first metal with a composition ratio of about 0.1 to about 50 at % is formed according to the present invention, the metal catalyst layer with a surface density of about $10^{13}$ to about $10^{15}$ atoms/cm$^2$ may be formed to be about 2 to about 1000 Å thick. Thus, the metal catalyst layer containing the first metal with a low density may be formed and the metal catalyst layer may be formed thick.

Figure 5A:
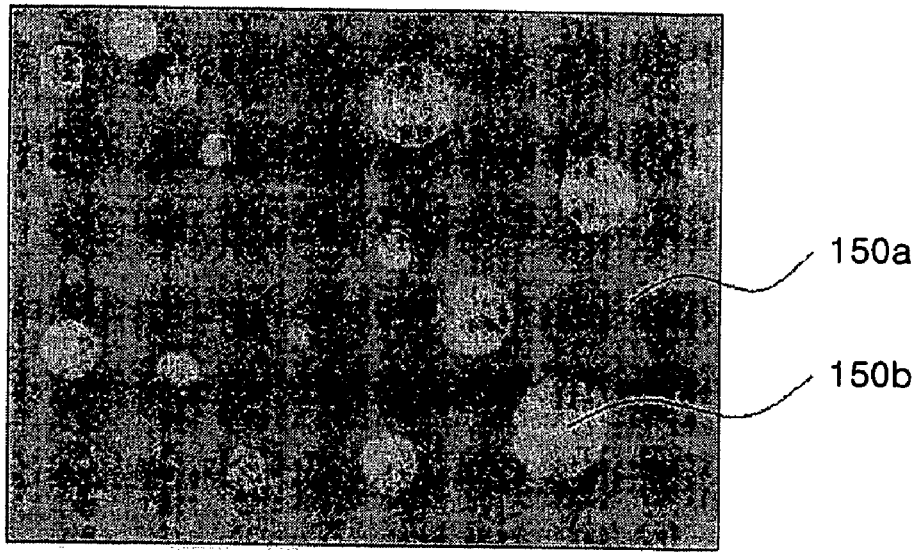
FIGS. 5A, 5B, 5C and 5D are photographs showing crystallization degrees of the amorphous silicon layer based on the thickness of a metal catalyst layer composed of only a metal catalyst.
Figure 5B:
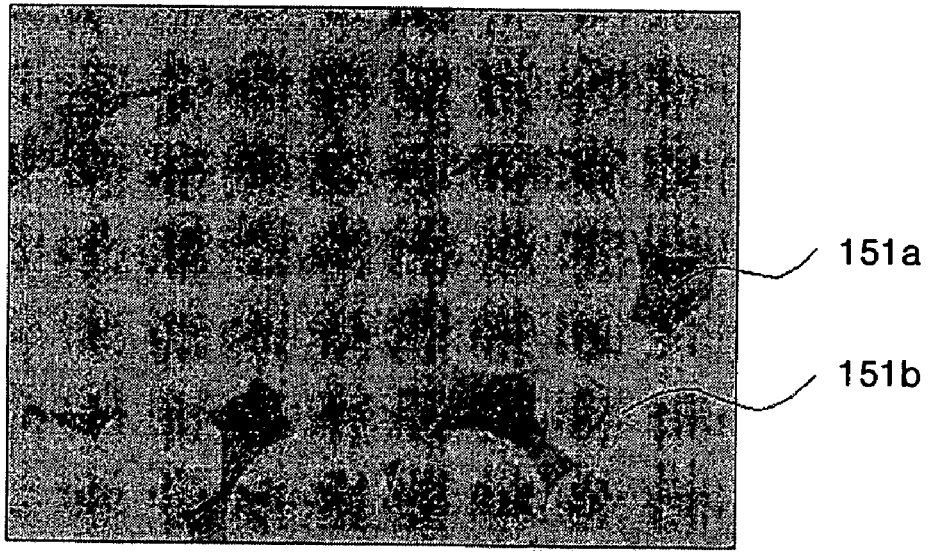
Figure 5C:
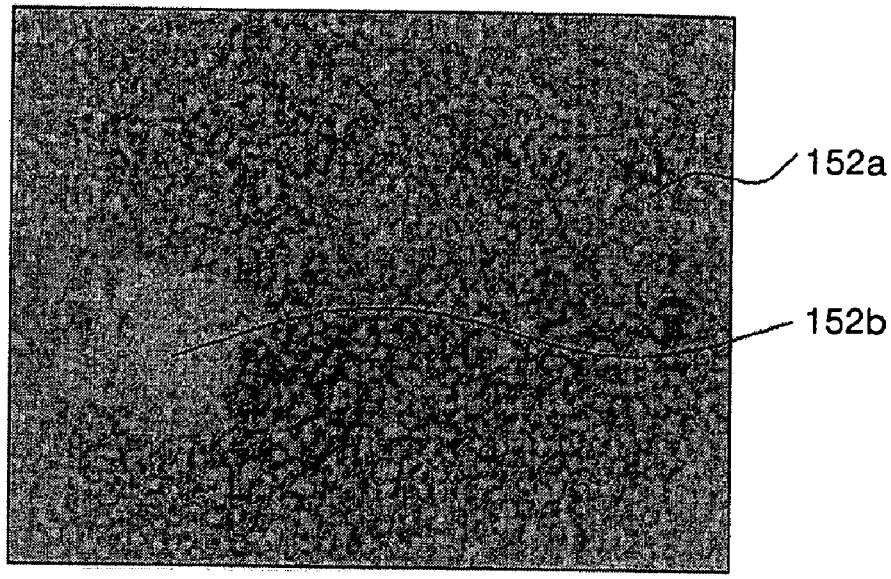
Figure 5D:
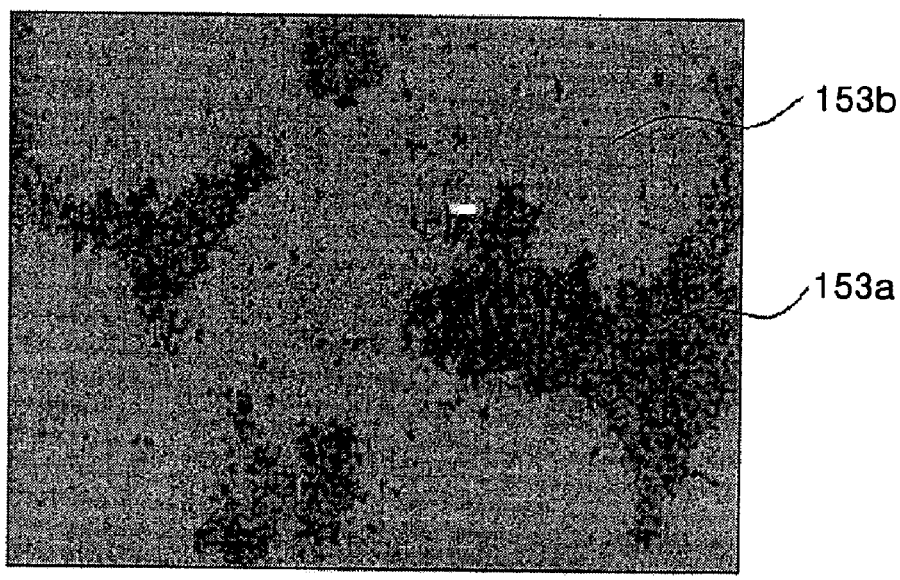

The first metal of the metal catalyst layer may be controlled to have a surface density of about $10^{13}$ to about $10^{15}$ atoms/cm$^2$ for the following reasons. Crystallization of the amorphous silicon layer can be significantly influenced by the surface density or the amount of the metal catalyst layer as shown in FIG. 5A, FIG. 5B, FIG. 5C, and FIG. 5D. That is, when the metal catalyst layer composed of only the first metal is formed to be about 0.5 Å thick or thinner, most of the amorphous silicon layer 150a can remain uncrystallized, and the crystallized portion 150b can be either absent or non-uniform as shown in FIG. 5A. In contrast, most of the region can be uniformly crystallized into the polycrystalline silicon layer 151b with little of the amorphous silicon layer 151a remaining uncrystallized as shown in FIG. 5B if the metal catalyst layer is controlled to be about 1 Å thick. When the thickness is about 1.5 Å (FIG. 5C) or 2.0 Å (FIG. 5D), crystallization may not readily occur (152a and 153a) and may not be uniform even when the crystallization has occurred (152b, 153b).

Accordingly, when the metal catalyst layer is formed using the target in which the first metal has a predetermined composition ratio in accordance with the present invention the first metal with a surface density of about $10^{13}$ to about $10^{15}$ atoms/cm$^2$ is present in the metal catalyst layer as is done with the 1 Å thick conventional metal catalyst layer even though the metal catalyst layer of the present invention may be about 100 Å thick.

Accordingly, about 2 to about 1000 times the concentration of the first metal may be readily controlled by adjusting the composition ratio of the first metal contained in the target in a range of about 0.1 to about 50 at % when the metal catalyst layer is formed using the target of the present invention instead of the conventional target.

Figure 3:
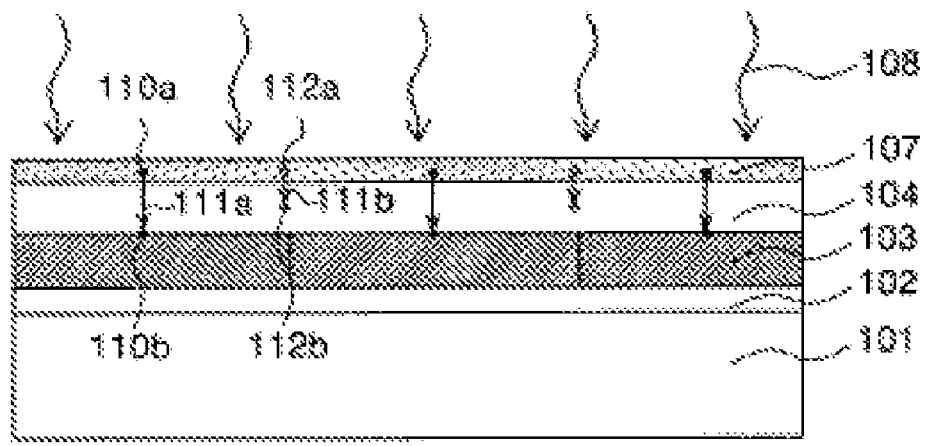
FIG. 3 is a cross-sectional view of a process of annealing the substrate to crystallize the amorphous silicon layer to a polycrystalline silicon layer.

FIG. 3 is a cross-sectional view of a process of annealing the substrate to crystallize the amorphous silicon layer to a polycrystalline silicon layer. As shown in FIG. 3, the substrate on which the buffer layer, the amorphous silicon layer, the capping layer, and the metal catalyst layer are already formed can be annealed (108) so that the amorphous silicon layer can be crystallized to a polycrystalline silicon layer. In this case, the annealing can be performed in two stages. A first annealing process can be performed at a temperature of about 200° C. to about 800° C. and a second annealing process can be performed at a temperature of about 400° C. to about 1300° C.

In the first annealing process, the first metal 110a within the metal catalyst layer is moved to the interface of the amorphous silicon layer (111a) to form a seed 110b of inducing crystallization of the amorphous silicon layer. The second metal 112a within the metal catalyst layer can also be diffused within the capping layer by the first annealing process (111b). However, the second metal has a lower diffusion speed than that of the first metal so that it may not move to the interface of the amorphous silicon layer but may remain within the capping layer (112b).

The second annealing process may be a process of crystallizing the amorphous silicon layer to the polycrystalline silicon layer by means of the seed formed by the first annealing process.

Figure 4:
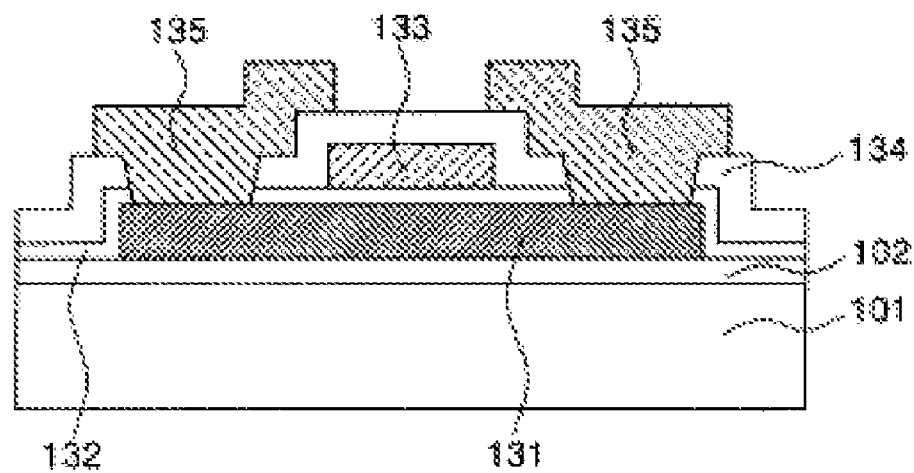
FIG. 4 is a cross-sectional view of a process of fabricating a TFT using the polycrystalline silicon layer formed by the present invention.

FIG. 4 is a cross-sectional view of a process of fabricating a TFT using the polycrystalline silicon layer formed by the present invention. As shown in FIG. 4, an amorphous silicon layer may be crystallized to a polycrystalline silicon layer by means of an annealing process, a metal catalyst layer and a capping layer may be removed, and the polycrystalline silicon layer may be patterned to form a semiconductor layer 131.

Subsequently, a gate insulating layer may be formed of a single layer or a multi-layer 132 of a silicon oxide layer or a silicon nitride layer on the substrate using CVD or PVD.

A gate electrode formation material may then be deposited on the substrate and may be patterned to form a gate electrode 133. Aa single or multi-layer of silicon oxide or silicon may then be used to form an interlayer insulating layer 134.

Predetermined regions of the gate insulating layer and the interlayer insulating layer may then be etched to form contact holes exposing predetermined regions of the semiconductor layer. Source and drain electrode formation material may then be formed to fill the contact holes and to contact the predetermined regions of the exposed semiconductor layer.

The source and drain electrode formation material may be patterned to form source and drain electrodes 135. Thus, the TFT may be completed.

The present invention provides, for example, a method of fabricating a TFT using a metal catalyst layer. The metal catalyst layer can be obtained using a sputtering target alloyed l s with a first metal and a second metal with a larger atomic weight than the first metal. This may in turn control the concentration of the first metal within the metal catalyst layer. Thus, the concentration may be readily adjusted about 2 to about 1000 times as much as it could previously be adjusted. This not only permits the metal catalyst layer to be formed thick but also facilitates uniform and stable control and significantly enhances uniformity and grain size of the polycrystalline silicon layer.

Although the invention has been particularly described with reference to certain embodiments thereof, changes may be made to these embodiments without departing from the scope of the invention.

What is claimed is:

1. A method of fabricating a thin film transistor (TFT), comprising:
    forming an amorphous silicon layer and a capping layer on a substrate;
    forming a metal catalyst layer on the capping layer using a sputtering target comprising an alloy containing a first metal and a second metal with a larger atomic weight than the first metal;
    annealing the substrate to crystallize the amorphous silicon layer to a polycrystalline silicon layer; and
    patterning the polycrystalline silicon layer to form a semiconductor layer,
    wherein the capping layer serves to cause a metal catalyst to be selectively diffused or penetrated when the metal catalyst of the metal catalyst layer is diffused or penetrated to an interface of the amorphous silicon layer, and
    wherein the first metal is a material that forms a seed so as to crystallize the amorphous silicon layer, and the second metal is a material remained within the capping layer.

2. The method of claim 1, wherein the metal catalyst layer comprises the first metal with a surface density of about $10^9$ to about $10^{15}$ atoms/cm$^2$.

3. The method of claim 1, wherein the metal catalyst layer comprises the first metal with a surface density of about $10^{13}$ to about $10^{15}$ atoms/cm$^2$.

4. The method of claim 1, wherein the metal catalyst layer is about 2 Å to about 1000 Å thick.

5. The method of claim 1, wherein the annealing process comprises a first annealing stage and a second annealing stage.

6. The method of claim 5, wherein the first annealing stage is performed at a temperature of about 200° C. to about 800° C., and the second annealing stage is performed at a temperature of about 400° C. to about 1300° C.

7. The method of claim 5, wherein the first annealing stage diffuses the first metal to a surface of the amorphous silicon layer, and the second annealing stage crystallizes the amorphous silicon layer to polycrystalline silicon.

8. The method of claim 1, wherein a diffusion speed of the first metal is greater than a diffusion speed of the second metal during the annealing process.

9. The method of claim 1, wherein the first metal is selected from the group consisting of Ni (nickel), Pd (palladium), Ti (titanium), Ag (silver), Au (gold), Al (aluminum), Sn (tin), Sb (antimony), Cu (copper), Co (cobalt), Mo (molybdenum), Tr (terbium), Ru (ruthenium), Rh (rhodium), Cd (cadmium), and Pt (platinum).

10. The method of claim 1, wherein the first metal is nickel, and the second metal is either molybdenum or tungsten.

11. The method of claim 1, wherein the first metal is present in a composition ratio of about 0.1 to about 50 at %, and the rest is the second metal.

12. The method of claim 1, wherein the first metal is present in a composition ratio of about 1 to about 2 at %, and the rest is the second metal.

* * * * *